US010425880B2

United States Patent
Baudoin et al.

(10) Patent No.: US 10,425,880 B2
(45) Date of Patent: Sep. 24, 2019

(54) METHOD FOR END-TO-END TRANSPARENT TRANSPORT OF DATA PACKETS WITHIN A SPACE TELECOMMUNICATIONS SYSTEM USING A NETWORK OF REGENERATIVE SATELLITES WITH ISLS

(71) Applicant: THALES, Courbevoie (FR)

(72) Inventors: Cédric Baudoin, Toulouse (FR); Nicolas Chuberre, Toulouse (FR); Mathieu Dervin, Toulouse (FR)

(73) Assignee: THALES, Courbevoie (FR)

( * ) Notice: Subject to any disclaimer, the term of this patent is extended or adjusted under 35 U.S.C. 154(b) by 272 days.

(21) Appl. No.: 15/413,229

(22) Filed: Jan. 23, 2017

(65) Prior Publication Data

US 2017/0230890 A1    Aug. 10, 2017

(30) Foreign Application Priority Data

Feb. 5, 2016   (FR) ...................................... 16 00194

(51) Int. Cl.
    *H04W 40/16*    (2009.01)
    *H04B 7/185*    (2006.01)

(52) U.S. Cl.
    CPC ........ *H04W 40/16* (2013.01); *H04B 7/18519* (2013.01); *H04B 7/18526* (2013.01);
    (Continued)

(58) Field of Classification Search
    None
    See application file for complete search history.

(56) References Cited

U.S. PATENT DOCUMENTS

| 2012/0127921 A1 | 5/2012 | Laufer |
| 2013/0034124 A1* | 2/2013 | Peyrotte ............... G01S 19/02 375/144 |

(Continued)

FOREIGN PATENT DOCUMENTS

| EP | 1 796 289 A2 | 6/2007 |
| EP | 1 981 202 A2 | 10/2008 |

OTHER PUBLICATIONS

European Telecommunications Standard Institute, EN 302 307 V1.1.2 (Jun. 2006), Digital Video Broadcasting (DVB); Second generation framing structure, channel coding and modulation systems for Broadcasting, Interactive Services, News Gathering and other broadband satellite applications, 2006.

(Continued)

*Primary Examiner* — Jason E Mattis
*Assistant Examiner* — Hong Shao
(74) *Attorney, Agent, or Firm* — Baker & Hostetler LLP

(57) ABSTRACT

An on-board method for the end-to-end transparent transport of data packets is implemented by a telecommunications system comprising a first, sending station, a second, receiving station, a first, sending satellite, connected directly to the first station, and a second, receiving satellite, connected directly to the second station, the first satellite and second satellite being interconnected via a spaceborne network. The transport method comprises steps allowing an end-to-end transparent adaptive control loop for the adaptive control of the modulation and of the coding of the access links between the first station and the first satellite and between the second station and the second satellite to be implemented.

17 Claims, 5 Drawing Sheets

(52) U.S. Cl.
CPC ..... *H04B 7/18584* (2013.01); *H04B 7/18586* (2013.01); *H04B 7/18589* (2013.01)

(56) References Cited

U.S. PATENT DOCUMENTS

2014/0056335 A1* 2/2014 Ryu ................... H04B 7/18519
375/211
2016/0037434 A1* 2/2016 Gopal ................. H04W 40/246
370/316

OTHER PUBLICATIONS

Coline Morel et al., "Link Adaptation Strategies for Next Generation Satellite Video Broadcasting: A System Approach," IEEE Transactions on Broadcasting, vol. 61, No. 4, Dec. 1, 2015, pp. 603-614, XP011592762.

* cited by examiner

METHOD FOR END-TO-END TRANSPARENT TRANSPORT OF DATA PACKETS WITHIN A SPACE TELECOMMUNICATIONS SYSTEM USING A NETWORK OF REGENERATIVE SATELLITES WITH ISLS

CROSS-REFERENCE TO RELATED APPLICATION

This application claims priority to foreign French patent application No. FR 1600194, filed on Feb. 5, 2016, the disclosure of which is incorporated by reference in its entirety.

FIELD OF THE INVENTION

The present invention relates to a method for the end-to-end transparent transport of data packets of large size, said the transport method being implemented by a spaceborne telecommunications system using a network of regenerative satellites which are equipped with inter-satellite links (ISLs).

The present invention also relates to a high-speed satellite telecommunications system configured to implement said method for the high-speed end-to-end transparent transport of packets of large size.

The technical field of the invention relates, in particular, to constellations of satellites intended to provide data stream trunking/backhauling services at very high speed, i.e. service speeds of higher than 50 Mbps per terminal, with inter-satellite links (ISLs) in order to define a spaceborne patrimonial network without ground infrastructure.

In general, it is sought to optimize the use of the frequency band or spectral resources allocated to the services and the complexity of the on-board processing of the satellites, the satellites allowing data packets structured into frames to be switched at very high speed.

BACKGROUND

One particular case of a high-speed satellite telecommunications system is that of a telecommunications system based on a constellation of regenerative satellites and capable of switching DVB-S2 frames such as defined in the ETSI (European Telecommunications Standard Institute) standard with the reference EN 302 307 V1.1.2 (2006-06) and entitled "Digital Video Broadcasting (DVB); Second generation framing structure, channel coding and modulation systems for Broadcasting, Interactive Services, News Gathering and other broadband satellite applications". This telecommunications system is described in the patent application entitled "Method for the very-high-speed transparent routing of data packets in a spaceborne telecommunications system using a network of regenerative satellite with ISLs", filed jointly with the present application.

The only solution at present, known and described in the ETSI standard EN 302 307 V1.1.2 (2006-06), for optimizing the spectral resources of a DVB-S2 frame transfer is to use a local adaptive coding and modulation (ACM) loop per link between a ground station and a satellite.

The use of such a local method leads to different modulation-coding parameter pairs on the two links formed by a first link between a first station and a first satellite on the one hand, and by a second link between a second satellite and a second station on the other hand. The use thereof in the case of DVB-S2 frame switching involves the implementation of segmentation solutions at the level of the GSE (generic stream encapsulation protocol) encapsulation layer or concatenation solutions at the level of the frames, leading, for the high speeds in question, to processing operations which are complex to perform.

Furthermore, in the case of high-speed links, this optimization based on the use of one ACM loop per (sending/receiving) ground station—(sending/receiving) on-board satellite link may also lead to substantial data losses in the buffer memories of the receiving satellite serving the receiving station if the budget of the corresponding downlink is unfavourable, along with an increase in the spectral efficiency that is not used in the case of an access with a single carrier per channel per carrier (SCPC) if the budget of the uplink between the sending station and the sending satellite is unfavourable.

The technical problem is to improve the performance, in terms of optimizing the spectral resources, of a very-high-speed end-to-end transport of data services, routed from a sending station to a receiving station via a packet-switching regenerative spaceborne satellite network, and to limit the on-board complexity of the equipment on-board the satellites allowing the switching of the data packets.

This technical problem is to be solved in particular in the case of transporting frames using the DVB-S2 protocol.

SUMMARY OF THE INVENTION

To this end, one subject of the invention is a method for the end-to-end transparent transport of data packets implemented by a satellite telecommunications system. The telecommunications system comprises: a first, sending station; a second, receiving station; a first, sending satellite, connected directly to the first station by a first electromagnetic uplink from the first station and by a first electromagnetic downlink from the first satellite; a second, receiving satellite, connected directly to the second station by a second electromagnetic uplink from the second station and by a second electromagnetic downlink from the second satellite. The first, sending satellite and the second, receiving satellite are interconnected via a spaceborne network comprising at least one inter-satellite link. The transparent transport method comprises a first step consisting in that the first, sending station transmits a first data message, intended for the second, receiving station and fragmented into a single or multiple first data packets, each first packet having a generic structure, or frame, defined by a predetermined standard. The transparent transport method additionally comprises the steps consisting in that:

in a second step, the first, sending satellite estimates a first signal-to-noise-plus-interference ratio SNIR1 of the first uplink on the basis of a first received current packet and inserts information representing the first ratio SNIR1 into a first data go-to field, added to the packet, and transparently retransmits said packet and the information contained within the first go-to field to the second satellite; then in a third step, the second satellite retransmits said first packet and the information contained within the first field to the second, receiving station; then in a fourth step, the second station estimates a second signal-to-noise-plus-interference ratio SNIR2 of the second downlink on the basis of said first packet retransmitted by the second satellite, then determines a third signal-to-noise-plus-interference ratio SNIR3 of a first complete link from the first station to the second station as being the minimum from the set formed by the first and second ratios SNIR1 and SNIR2, then inserts information representing the third ratio into a first data return field, added to or already included within a second packet of a second message intended for the first station, and transmits said second packet and the information contained within the first return field to the first station via the second satellite, the spaceborne network and the first satellite; then in a fifth step, the first station determines a first pair of modulation and coding parameters adapted according to the third ratio SNIR3 sent by the second station and transmits the packets of the first message or of other messages intended for the second station according to the first pair of parameters.

According to particular embodiments, the transport method comprises one or more of the following features:

the first, second and third signal-to-noise-plus-interference ratios SNIR1, SNIR2, SNIR3 are estimated periodically according to a predetermined period expressed in time or in number of packets;

in the fourth step, the second station also inserts information representing the second ratio SNIR2 into the first data return field, and the transport method additionally comprises a sixth step, interposed between the fourth step and the fifth step, in which the second satellite receives and extracts the second and third ratios SNIR2, SNIR3, then adapts the current modulation of the second downlink according to the highest value from the second and third ratios SNIR2, SNIR3 while leaving the current coding unchanged;

the transport method additionally comprises the steps consisting in that: in a seventh step, subsequent to the fourth step, the second, receiving satellite estimates a fourth signal-to-noise-plus-interference ratio SNIR4 of the second uplink on the basis of a second received current packet and inserts information representing the fourth ratio SNIR4 into a second data go-to field, added to the second packet, and transparently retransmits said second packet and the information contained within the second go-to field to the first satellite; then, in an eighth step, the first satellite retransmits said second packet and the information contained within the second go-to field to the first station; then, in a ninth step, the first station estimates a fifth signal-to-noise-plus-interference ratio SNIR5 of the first downlink on the basis of said second packet retransmitted by the first satellite, then determines a sixth signal-to-noise-plus-interference ratio SNIR6 of a second complete link from the second station to the first station as being the minimum from the set formed by the fourth and fifth ratios SNIR4 and SNIR5, then inserts information representing the sixth ratio SNIR6 into a second data return field, added to a first packet of the first message or of another message intended for the second station, and transmits said first packet and the information contained within the second return field to the second station via the first satellite, the spaceborne network and the second satellite; then, in a tenth step, the second station determines a second pair of modulation and coding parameters adapted according to the sixth ratio SNIR6 sent by the first station and transmits the packets of the second message or of other messages intended for the first station;

the fourth, fifth and sixth signal-to-noise-plus-interference ratios SNIR4, SNIR5, SNIR6 are estimated periodically according to a predetermined period expressed in time or in number of packets;

in the ninth step, the first station also inserts information representing the fifth ratio SNIR5 into the second data return field; and the transport method additionally comprises an eleventh step, interposed between the ninth step and the tenth step, in which the first satellite receives and extracts the fifth and sixth ratios SNIR5, SNIR6, then adapts the current modulation of the first downlink according to the highest value from the fifth and sixth ratios SNIR5, SNIR6 while leaving the current coding unchanged;

the signalling steps, consisting of inserting and extracting the information representing the ratios SNIR1, SNIR2, SNIR3, SNIR4, SNIR5, SNIR6 added to the packets into/from a first field and a second field, are replaced by steps of routing the measurements of SNIR1, SNIR2, SNIR3, SNIR4, SNIR5, SNIR6 and of rerouting said measurements to the appropriate station from among the first station and the second station or to the appropriate satellite chosen from among the sending satellite and the receiving satellite, the routing and rerouting steps being implemented by a central coordination station for coordinating the telecommunications system;

the one or more data packets of the first data packet and/or of the second data packet have the structure of a coded or uncoded baseband frame BBFRAME such as defined by the DVB-S2 protocol;

the data packets switched on board the satellites are data packets having the structure of a baseband frame BBFRAME coded according to the DVB-S2 protocol and retaining the end-to-end coding structure.

Another subject of the invention is a satellite telecommunications system for the end-to-end high-speed transparent transport of data and comprising: a first, sending station; and a second, receiving station; and a first, sending satellite, connected directly to the first station by a first electromagnetic uplink from the first station and by a first electromagnetic downlink from the first satellite; and a second, receiving satellite, connected directly to the second station by a second electromagnetic uplink from the second station and by a second electromagnetic downlink from the second satellite; the first, sending satellite and the second, receiving satellite being interconnected via a spaceborne network comprising at least one inter-satellite link; the first, sending station being configured, in a first step, to transmit a first data message, intended for the second, receiving station and fragmented into a single or multiple first data packets, each first packet having a generic structure, or frame, defined by a predetermined standard. The telecommunications system is characterized in that:

the first, sending satellite is configured to estimate, in a second step, a first signal-to-noise-plus-interference ratio SNIR1 of the first uplink on the basis of first received current packet and inserts information representing the first ratio SNIR1 into a first data go-to field, added to the packet, and transparently retransmits said packet and the information contained within the first go-to field to the second satellite; and the second, receiving satellite is configured to retransmit, in a third step, said first packet and the information contained within the first field to the second, receiving station; and the second station is configured to estimate, in a fourth step, a second signal-to-noise-plus-interference ratio SNIR2 of the second downlink on the basis of said first packet retransmitted by the second satellite, then determine a third signal-to-noise-plus-interference ratio SNIR3 of a first complete link from the first station to the second station as being the minimum from the set formed by the first and second ratios SNIR1 and SNIR2, then inserts information representing the third ratio SNIR3 into a first data return field, added to or already included within a second packet of a second message intended for the first station, and transmit said second packet and the information contained within the first return field to the first station via the second satellite, the spaceborne network and the first satellite; and the first station is configured to determine, in a fifth step, a first pair of modulation and coding parameters adapted according to the third ratio SNIR3 sent by the second station and to transmit the packets of the first message or of other messages intended for the second station according to the first pair of parameters.

According to particular embodiments, the satellite telecommunications system comprises one or more of the following features:

the second, receiving satellite is configured to estimate, in a seventh step subsequent to the fourth step, a fourth signal-to-noise-plus-interference ratio SNIR4 of the second uplink on the basis of a second received current packet and inserts information representing the fourth ratio SNIR4 into a second go-to field, added to the second packet, and transparently retransmit said second packet and the information contained within the second go-to field to the first satellite; and the first satellite is configured to retransmit, in an eighth step, said second packet and the information contained within the second go-to field to the first station; and the first station is configured to estimate, in a ninth step, a fifth signal-to-noise-plus-interference ratio SNIR5 of the first downlink on the basis of said second packet retransmitted by the first satellite, then determine a sixth signal-to-noise-plus-interference ratio SNIR6 of a second complete link from the second station to the first station as being the minimum from the set formed by the fourth and fifth ratios SNIR4 and SNIR5, then insert information representing the sixth ratio SNIR6 into a second data return field, added to a first packet of the first message or of another message intended for the second station, and transmit said first packet and the information contained within the second return field to the second station via the first satellite, the spaceborne network and the second satellite; and the second station is configured to determine, in a tenth step, a second pair of modulation and coding parameters adapted according to the sixth ratio SNIR6 sent by the first station and transmit the packets of the second message or of other messages intended for the first station;

the telecommunications system additionally comprises a central coordination station for coordinating the telecommunications system; and the signalling steps, consisting of inserting and extracting the information representing the ratios SNIR1, SNIR2, SNIR3, SNIR4, SNIR5, SNIR6 added to the packets into/from a first field and a second field, are replaced by steps of routing the measurements of SNIR1, SNIR2, SNIR3, SNIR4, SNIR5, SNIR6 and of rerouting said measurements to the appropriate station from among the first station and the second station or to the appropriate satellite chosen from among the sending satellite and the receiving satellite, the central coordination station for coordinating the telecommunications system being configured to implement said signal routing and rerouting steps.

Another subject of the invention is a computer program or product comprising a set of instructions that are configured to implement the transparent transport method such as defined above when they are loaded into and executed by one or more computers implemented in the telecommunications system such as defined above.

BRIEF DESCRIPTION OF THE DRAWINGS

The invention will be better understood upon reading the description of several embodiments which will follow, given solely by way of example and while referring to the drawings in which.

DETAILED DESCRIPTION

In general, the invention is based on the concept of implementing an end-to-end adaptive control loop for the adaptive control of coding and modulation (ACM; adaptive coding and modulation) in order to adapt the modulation and the coding, used by the high-speed stations or terminals and the satellites of a spaceborne telecommunications system which uses regenerative satellites equipped with ISLs.

Hereinafter, the term "station" will generally refer to a terminal of the satellite system which is fixed or mobile on the ground, or on board an aircraft or a high-altitude balloon.

However, a station located on the ground will preferably be considered here due to a greater benefit afforded by the invention in comparison to more dynamically changing propagation conditions of electromagnetic radiation on the radiofrequency links connecting the sending and receiving stations and the access satellites of the satellite constellation.

Figure 1:
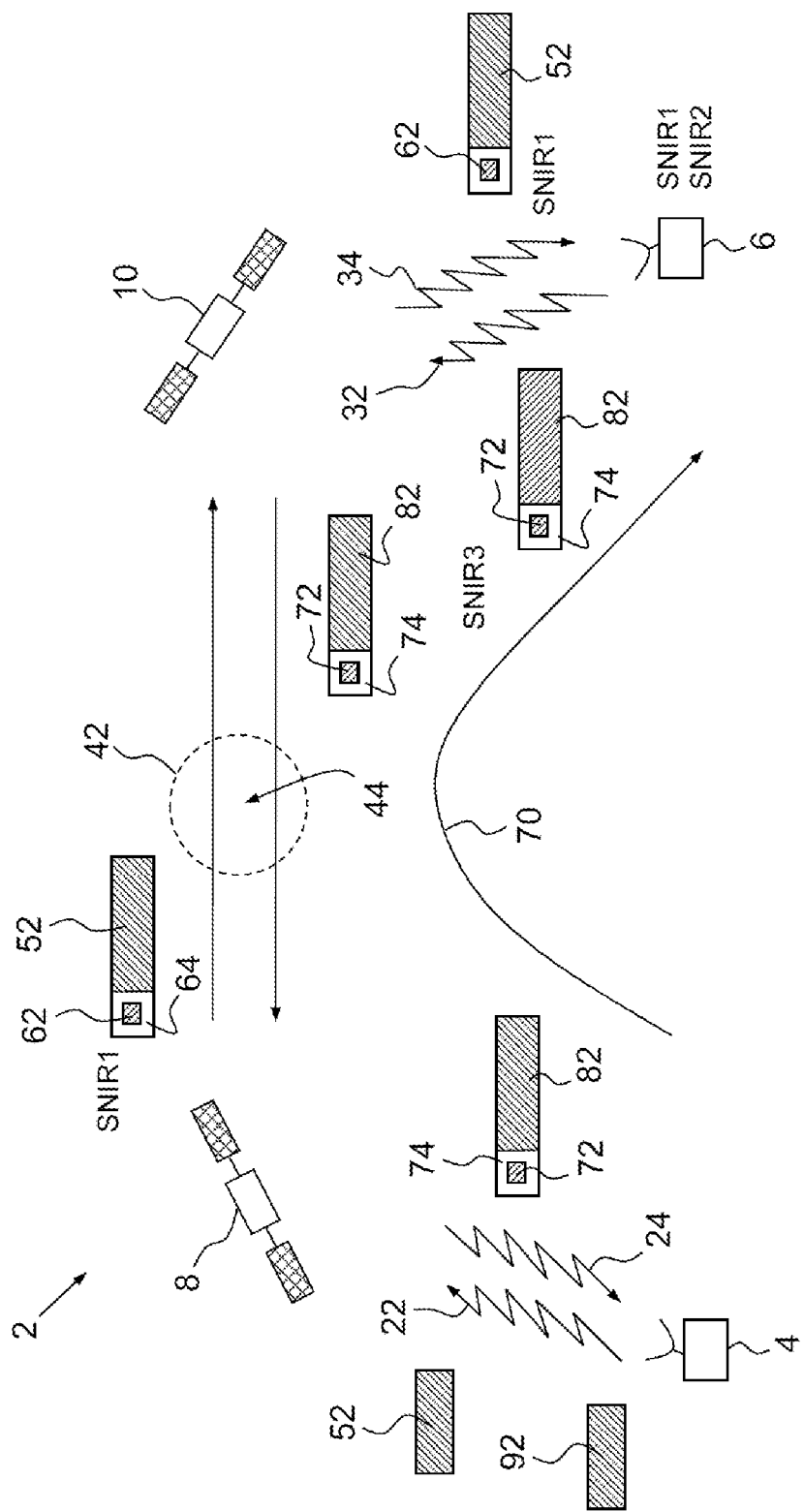
FIG. 1 is a view of a satellite telecommunications system, configured to implement a method for the end-to-end transparent transport, according to the invention, of data packets along a first complete link from a first, sending station to a second, receiving station.

According to FIG. 1, a satellite telecommunications system 2 for the end-to-end high-speed transparent transport of data comprises a first, sending station 4, a second, receiving station 6, a first, sending satellite 8 and a second, receiving satellite 10.

The first, sending satellite 8 is connected directly to the first station 4 by a first radiofrequency uplink 22 from the first, sending station 4 and by a first radiofrequency downlink 24 from the first, sending satellite 8.

The second, receiving satellite 26 is connected directly to the second, receiving station 6 by a second radiofrequency uplink 32 from the second, receiving station 6 and by a second radiofrequency downlink 34 from the second, receiving satellite 10.

The first, sending satellite 8 and the second, receiving satellite 10 are interconnected via a spaceborne network 42, represented by a ring of dotted lines in FIG. 1, comprising at least one inter-satellite link 44. In general, the spaceborne network 42 may comprise other satellites being used as relays and inter-satellite links connecting the satellites to one another. The satellites of the spaceborne network, including the first, sending satellite and the second, receiving satellite, may belong to one and the same constellation from among, in particular, LEO (low Earth orbit)-type constellations and MEO (medium Earth orbit)-type constellations, or belong to hybrid constellations with, potentially, one or more geostationary satellites. In a preferred manner, the satellites of the spaceborne network, an integral part of the telecommunications system, belong to an LEO-type constellation.

The first, sending station 4 is configured to transmit, in a first step, a first data message, intended for the second, receiving station 6 and fragmented into a single or multiple first data packets, each first packet having a generic structure, or frame, defined by a predetermined standard. Here, in FIG. 1, a first current packet 52, transmitted by the first, sending station 4, along with a first packet 54 of the first message transmitted prior to the first current packet 52 and given by way of example, are shown.

The first, sending satellite 8 is configured to estimate, in a second step, a first signal-to-noise-plus-interference ratio SNIR1 of the first uplink 22 on the basis of a first received current packet 52 and inserts information 62 representing the first ratio SNIR1 into a first data go-to field 64, added to the first packet 52, and transparently retransmit said packet 52 and the information 62 contained within the first data field 64 to the second, receiving satellite 10 via the spaceborne network 42.

The second, receiving satellite 10 is configured to retransmit, in a third step, said first packet 52 and the information 62 contained within the first data go-to field 64 to the second, receiving station 6.

The second, receiving station 8 is configured to estimate, in a fourth step, a second signal-to-noise-plus-interference ratio SNIR2 of the second downlink 34 on the basis of said first packet 52 retransmitted by the second, receiving satellite 10, then determine a third signal-to-noise-plus-interference ratio SNIR3 of a first complete link 70 from the first, sending station 4 to the second, receiving station 6 as being the minimum from the set formed by the first and second ratios SNIR1 and SNIR2.

The second, receiving station 8 is configured to subsequently insert, in the same fourth step, return information 72 representing the third ratio SNIR3 into a first data return field 74, added to a second packet 82 of a second message intended for the first, sending station 4, and transmit said second packet 82 and the return information 72 contained within the first data return field 74 to the first, sending station 4 via the second, receiving satellite 10, the spaceborne network 42 and the first, sending satellite 8.

The first, sending station 4 is configured to determine, in a fifth step, a first pair of modulation and coding parameters adapted according to the return information 72 representing the third ratio SNIR3 sent by the second, receiving station 6 and transmit, subsequent to the first current packet 52, one or more first packets 54 of the first message.

In a variant, one or more of the radiofrequency links from among the first radiofrequency uplink 22, the first radiofrequency downlink 24, the second radiofrequency uplink 32 and the second radiofrequency downlink 34 are optical links.

In general, the first radiofrequency uplink, the first radiofrequency downlink, the second radiofrequency uplink and the second radiofrequency downlink are electromagnetic links.

Figure 2:
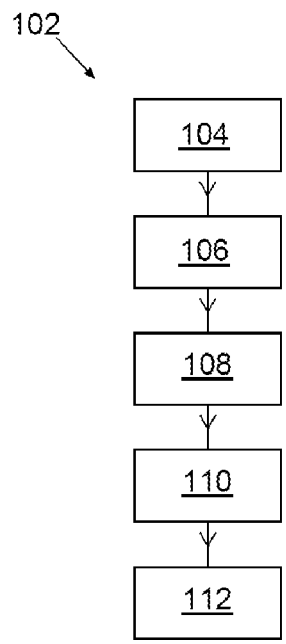
FIG. 2 is a flowchart of a first embodiment of an end-to-end transparent transport method according to the invention in which the high-speed data packets are routed along a first complete link from a first, sending station to a second, receiving station, the end-to-end transparent transport method being implemented by the satellite telecommunications system of FIG. 1.

According to FIG. 2, a method for the end-to-end transparent transport 102 of data packets is implemented by the satellite telecommunications system 2 of FIG. 1 and comprises first, second, third, fourth and fifth steps 104, 106, 108, 110 and 112.

In the first step 104, the first, sending station 4 transmits a first current packet 52 of a first data message, intended for the second, receiving station 6, the first message having been fragmented into multiple first data packets, each first packet having a generic structure, or frame, defined by a predetermined standard. For example, each first packet is a, coded or uncoded, BBFRAME packet defined according to the lm DVB-S2 protocol.

Next, in the second step 106, the first, sending satellite 8 measures and estimates, with the aid of a receiver and/or a demodulator, a first signal-to-noise-plus-interference ratio SNIR1 of the first uplink 22 on the basis of the first received current packet and inserts go-to information representing the first ratio SNIR1 into a first data go-to field 64, added to the first current packet 52, and transparently retransmits said first current packet 52 and the go-to information 62, contained within the first go-to field 64, to the second, receiving satellite 8 via the satellite network 42.

Then, in a third step 108, the second, receiving satellite 10 retransmits said first packet 52 and the go-to information 62, contained within the first go-to field 64, to the second, receiving station 6.

Next, in the fourth step 110, the second, receiving station 6 measures and estimates, with the aid of a receiver and/or a demodulator, a second signal-to-noise-plus-interference ratio SNIR2 of the second downlink 34 on the basis of said first current packet 52 retransmitted by the second satellite 10, then determines a third signal-to-noise-plus-interference ratio SNIR3 of a first complete link 70 from the first, sending station 4 to the second, receiving station 6 as being the minimum from the set formed by the first and second ratios SNIR1 and SNIR2.

Then, in the fourth step 110, the second, receiving station 6 inserts return information 72 representing the third ratio SNIR3 into the first data return field 74, added to a second data packet 82 of a second message intended for the first, sending station 4, and transmits said second packet 82 and the return information 72, contained within the first data return field 74, to the first, sending station 4 via the second, receiving satellite 10, the spaceborne network 42 and the first, sending satellite 8.

Next, in the fifth step 112, the first, sending station 4 determines a first adapted pair of modulation and coding parameters ACM adapted according to the return information 72, representing the third ratio SNIR3 sent by the second, receiving station 6, and transmits, subsequent to the first current packet 52, one or more subsequent first packets 92.

Periodically, first subsequent packets 92 are considered as first current packets and the first, second, third, fourth and fifth steps 104, 106, 108, 110, 112 are correspondingly applied anew thereto.

The first, second, third, fourth and fifth steps 104, 106, 108, 110, 112 thus form a loop for the adaptation of the coding and of the modulation of the end-to-end link 70 which makes the transport of data packets of large size in the telecommunications system 2 transparent with improved spectral efficiency.

In general, the first, second and third signal-to-noise-plus-interference ratios SNIR1, SNIR2, SNIR3 are estimated periodically according to a predetermined period expressed in time or in number n of packets.

Preferably, the number n of packets setting the periodicity of the estimations of the three signal-to-noise-plus-interference ratios SNIR1, SNIR2, SNIR3 is greater than or equal to two, in order to limit the on-board processing operations to be performed by the satellites.

The transport of the information representing the ratios SNIR1 and SNIR3 is carried out by a first data field having a number of bits of between 4 and 16 bits, preferably equal to 8 bits.

The first field is added and positioned as a header, as a trailer or within the data packet of large size when the packet is coded according to a predetermined standard, or it is retained as a header within the payload of the packet when the packet is not coded and defined according to a predetermined standard.

The end-to-end adaptive control loop for the adaptive control of coding and modulation (ACM; adaptive coding and modulation) thus performed makes it possible to adapt the modulation and coding used by the high-speed stations or terminals and the satellites during a high-speed end-to-end transport of packets of large size from the sending station to the receiving station. This loop allows the size of the buffer memories on the downlink from the receiving satellite to the receiving station to be limited.

Furthermore, as the coding is hardly changed, or even not changed at all, over the entire communication path, it is possible to transparently route BBFRAME frames without additional on-board processing, resulting in an optimization of the spectral resources.

Figure 3:
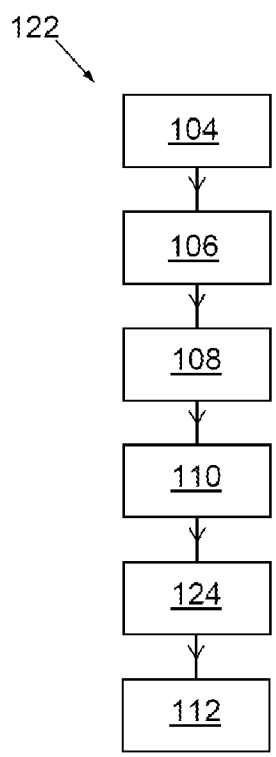
FIG. 3 is a flowchart of a variant of the method of FIG. 2 in which a local loop for adapting the modulation on the downlink of the second, receiving satellite has been added.

According to FIG. 3 and a variant of the method for the end-to-end transparent transport 102 of data packets of FIG. 2, a method for the end-to-end transparent transport 122 of data packets according to the invention comprises the same steps 104, 106, 108, 110, 112 as the transport method 102 of FIG. 2, and additionally comprises a sixth step 124, interposed between the fourth step 110 and the fifth step 112.

Here it is assumed that, in the fourth step, the second station also inserts information representing the second ratio SNIR2 into the first data return field.

In the sixth step 124, the second, receiving satellite 10 receives and extracts the second and third ratios SNIR2, SNIR3, then adapts the current modulation of the second downlink, implemented by the second, receiving satellite 10, according to the highest value from set formed by the second and third ratios SNIR2, SNIR3, while leaving the current coding unchanged.

Figure 4:
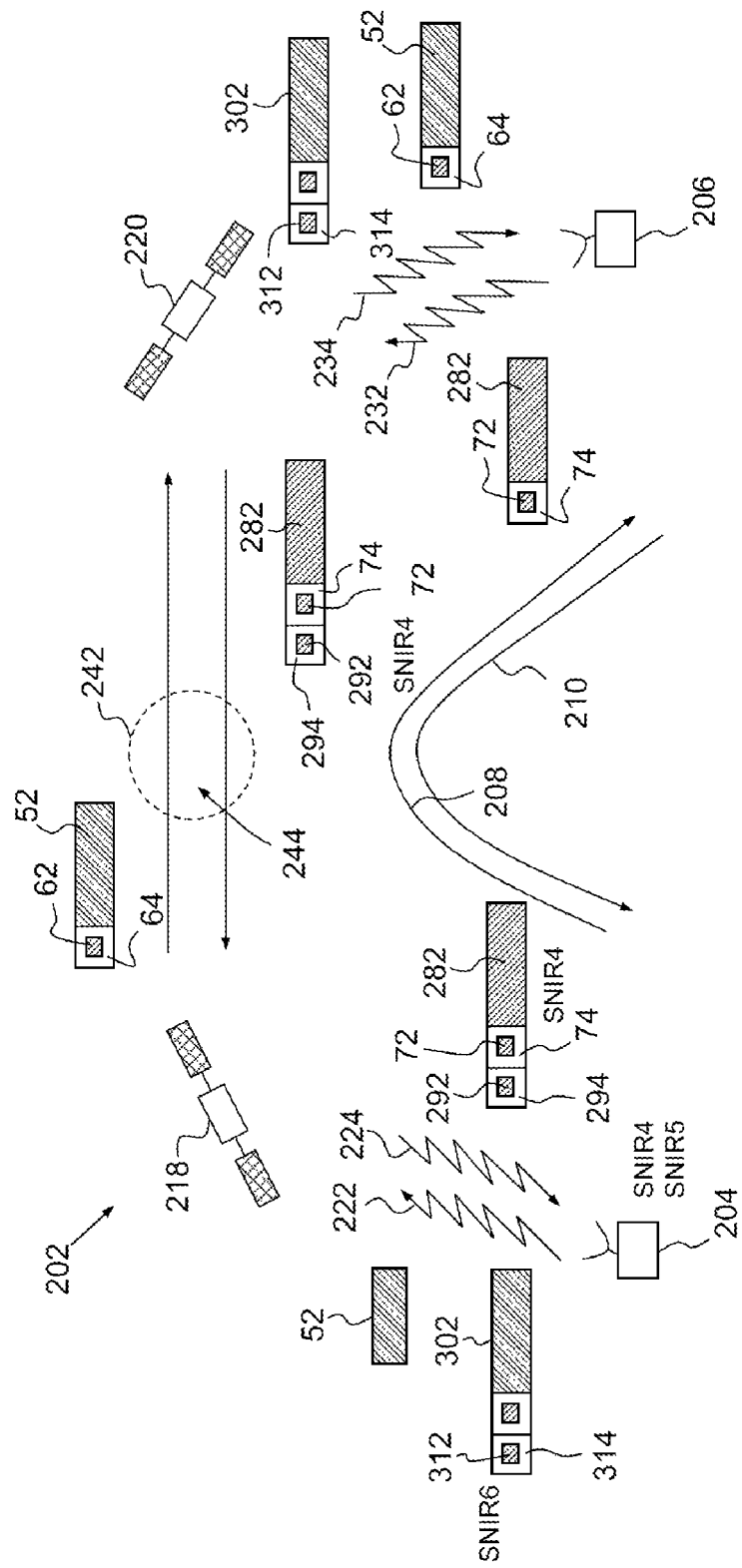
FIG. 4 is a view of a satellite telecommunications system according to the invention, derived from that of FIG. 1, and configured to implement an end-to-end transparent bidirectional transport method of traffic data packets along a first complete link oriented in a first direction from a first station to a second station, and traffic data packets along a second complete link oriented in a second direction, the reverse of the first direction, from the second station to the first station.

According to FIG. 4 and a second embodiment, a satellite telecommunications system 202 according to the invention, derived from the satellite telecommunications system 2 of FIG. 1, is configured to implement a method for the end-to-end transparent bidirectional transport of data packets along a first complete link 208 oriented in a first direction from a first station 204 to a second station 206, and of data packets along a second complete link 210 oriented in a second direction, the reverse of the first direction, from the second station 206 to the first station 204.

The satellite telecommunications system 202 for the end-to-end high-speed transparent bidirectional transport of traffic data comprises, like the telecommunications system 2, the first station 204, considered as a first, sending station with respect to the first complete link 208, the second, receiving station 206, considered as a second, receiving station with respect to the first complete link 208, a first satellite 218 and a second satellite 220, considered as a first, sending satellite and a second, receiving satellite with respect to the first link 208. Here, the first link 208 corresponds to the first end-to-end link 70 of the telecommunications system 2 of FIG. 1.

Hereinafter, the first station 204 and the second station 206 will, by convention, be referred to as "first, sending station" and "second, receiving station", respectively, even if the first station 204 and the second station 206 actually constitute a receiving station and a sending station, respectively, with respect to the second end-to-end link 210.

Hereinafter, the first satellite 218 and the second satellite 220 will, by convention, be referred to as "first, sending satellite" and "second, receiving satellite", respectively, even if the first satellite 218 and the second satellite 220 actually constitute a receiving satellite and a sending satellite, respectively, with respect to the second end-to-end link 210.

The first, sending satellite 218 is connected directly to the first station 204 by a first radiofrequency uplink 222 from the first, sending station 204 and by a first radiofrequency downlink 224 from the first, sending satellite 218.

The second, receiving satellite 220 is connected directly to the second, receiving station 206 by a second radiofrequency uplink 232 from the second, receiving station 206 and by a second radiofrequency downlink 234 from the second, receiving satellite 220.

The first, sending satellite 218 and the second, receiving satellite 220 are interconnected via a spaceborne network 242, represented by a ring of dotted lines in FIG. 4, comprising at least one inter-satellite link 244.

It should be noted that despite the spaceborne network 242 being represented by a ring, the spaceborne network 242 may be without a loop and be an open network.

The first, sending station 204, the second, receiving station 206, the first, sending satellite 218, the second, receiving satellite 220 and the spaceborne network 242 are configured, like the first, sending station 4, second, receiving station 6, first, sending satellite 8, second, receiving satellite 10 and spaceborne network 42 of FIG. 1, to implement the method for the high-speed transparent transport 102 of packets of FIG. 2 and its variant 122 of FIG. 3, in which the first packets 52, of high speed and large size, of a first message are routed from the first, sending station 4 to the second, receiving station 6.

Here, in FIG. 4, the first packet, the information representing the first ratio SNIR1, the first data go-to field, the information representing the third ratio SNIR3 and the first data return field are denoted, respectively, by the same numerical references 52, 62, 64, 72, 74 as the corresponding elements of FIG. 1.

Here, in FIG. 4, a second packet 282 of a second message, corresponding to the second packet 82 of FIG. 1, differs from said second packet 82 in that it is exclusively a high-speed second packet of large size, intended to route, symmetrically in terms of load, traffic on the second end-to-end link 210 from the second, receiving station 206 to the first, sending station 204.

Thus, the satellite telecommunications system 202 is configured to implement the first, second, third, fourth, fifth and sixth steps 104, 106, 108, 110, 112, 114 of the end-to-end transport methods of FIGS. 2 and 3.

According to FIG. 4, the second, receiving station 206 is configured to insert, in the fourth step, the return information 72 representing the third ratio SNIR3 into the first data return field 74, added to a second current packet 282 of the second message intended for the first, sending station 204, and transmit said second current packet 282 and the return information 72 contained within the first data return field 74 to the first, sending station 204 via the second, receiving satellite 220, the spaceborne network 242 and the first, sending satellite 218.

The second, receiving satellite 220 is configured to measure and estimate, via a receiver and/or a demodulator and in a seventh step subsequent to the fourth step 110 and prior to the fifth step 112, a fourth signal-to-noise-plus-interference ratio SNIR4 of the second uplink 232 on the basis of the second received current packet 282 and inserts information 292 representing the fourth ratio SNIR4 into a second data go-to field 294, added to the second packet 282, and transparently retransmit said second packet 282, the information 72 contained within the first return field 74 and the information 292 contained within the second go-to field 294 to the first, sending satellite 218.

The first, sending satellite 218 is configured to retransmit, in an eighth step, said second current packet 282, the first return field 74 and its contents 72, and the second go-to field 294 and its contents 292.

The first, sending station 204 is configured to measure and estimate, in a ninth step, a fifth signal-to-noise-plus-interference ratio SNIR5 of the first downlink 224 on the basis of said second packet 282 retransmitted by the first, sending satellite 218, then determine a sixth signal-to-noise-plus-interference ratio SNIR6 of the second complete link 210 from the second, receiving station 206 to the first, sending station 204 as being the minimum from the set formed by the fourth and fifth ratios SNIR4 and SNIR5, then insert information 312 representing the sixth ratio SNIR6 into a second data return field 314, added to a first packet 302 of the first message intended for the second, receiving station 206, and transmit said first packet 302 and the information 312 contained within the second return field 314 to the second, receiving station 206 via the first, sending satellite 218, the spaceborne network 242 and the second, receiving satellite 220.

The second, receiving station 206 is configured to determine, in a tenth step, a second pair of modulation and coding parameters adapted according to the return information 312 representing the sixth ratio SNIR6 and sent by the first, sending station 204, and transmit, subsequent to the second current packet 282, one or more second packets of the second message.

In a variant, one or more of the radiofrequency links from among the first radiofrequency uplink 222, the first radiofrequency downlink 224, the second radiofrequency uplink 232 and the second radiofrequency downlink 234 are optical links.

In general, the first radiofrequency uplink, the first radiofrequency downlink, the second radiofrequency uplink and the second radiofrequency downlink are electromagnetic links.

Figure 5:
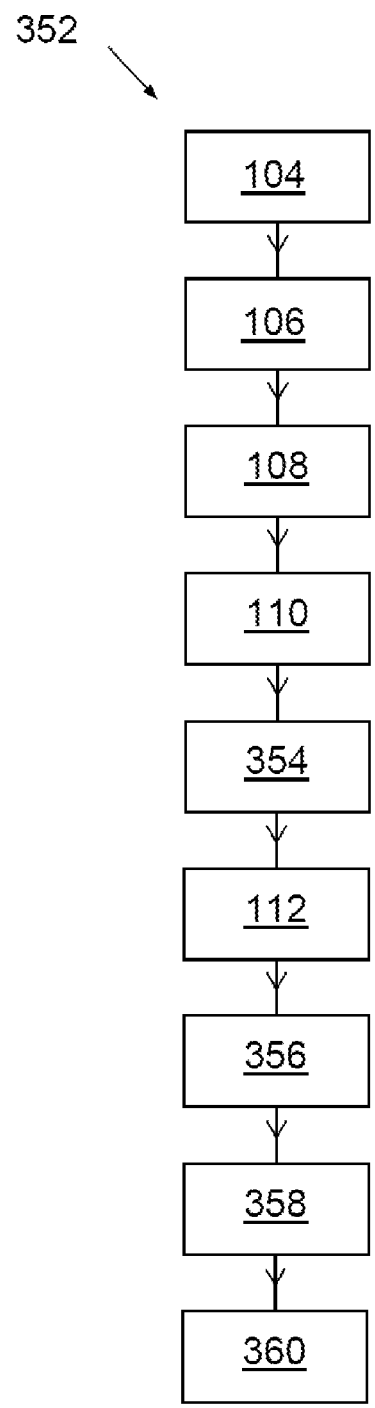
FIG. 5 is a flowchart of a second embodiment of an end-to-end transparent bidirectional transport method according to the invention in which the high-speed traffic data packets are routed along a first complete link oriented in a first direction from a first station to a second station, and high-speed traffic data packets are routed along a second complete link oriented in a second direction, the reverse of the first direction, from the second station to the first station.

According to FIG. 5 and a second embodiment of an end-to-end transparent transport method, a method for the high-speed end-to-end transparent transport 352 of data packets is implemented by the telecommunications system 202 of FIG. 4.

In the end-to-end transparent transport method 352, first high-speed traffic data packets are routed along the first complete link 208 from the first station 204 to the second station 206, and second high-speed traffic data packets are routed along the second complete link 210 from the second station 206 to the first station 204.

The end-to-end transparent transport method 352 is derived from the end-to-end transparent transport method 102, and comprises the same first, second, third, fourth and fifth steps 104, 106, 108, 110, 112.

The transparent transport method 352 additionally comprises seventh, eighth and ninth steps 354, 356, 358.

In the seventh step 354, subsequent to the fourth step 110 and prior to the fifth step 112, the second, receiving satellite 220 measures and estimates a fourth signal-to-noise-plus-interference ratio SNIR4 of the second uplink 232 on the basis of a second received current packet 282 and inserts information 292 representing the fourth ratio SNIR4 into a second data go-to field 294, added to said second current packet, and transparently retransmits said second packet 282, the information 72 contained within the first return field and the information 292 contained within the second go-to field 294 to the first, sending satellite 218.

Then, in the eighth step 356, the first, sending satellite 204 retransmits said second current packet 292, the first return field 74 and its contents 72, and the second go-to field 294 and its contents 292.

Next, in the ninth step 358, the first, sending station 204 measures and estimates a fifth signal-to-noise-plus-interference ratio SNIR5 of the first downlink 224 on the basis of said second packet 282 retransmitted by the first, sending satellite 218, then determines a sixth signal-to-noise-plus-interference ratio SNIR6 of the second complete link 210 from the second station 206 to the first station 204 as being the minimum from the set formed by the fourth and fifth ratios SNIR4 and SNIR5, then inserts information 312 representing the sixth ratio SNIR6 into a second data return field 314, added to a first packet 302 of the first message intended for the second station 206, and transmits said first packet 302 and the information 312 contained within the second return field 314 to the second station 206 via the first satellite 218, the spaceborne network 242 and the second satellite 220.

Then, in the tenth step 360, the second, receiving station 206 determines a second pair of modulation and coding parameters adapted according to the return information 312 representing the sixth ratio SNIR6 sent by the first, sending station 204 and transmits, subsequent to the second current packet 282, one or more second packets of the second message.

In general, the first, second and third signal-to-noise-plus-interference ratios SNIR1, SNIR2, SNIR3 are estimated periodically according to a predetermined period expressed in time or in number n of packets.

Preferably, the number n of packets setting the periodicity of the estimations of the six signal-to-noise-plus-interference ratios SNIR1, SNIR2, SNIR3, SNIR4, SNIR5, SNIR6 is greater than or equal to two, in order to limit the on-board processing operations to be performed by the satellites.

The transport of the information representing the ratios SNIR1, SNIR3, SNIR4 and SNIR6 is carried out by a first data field and a second data field, each having a number of bits of between 4 and 16 bits, preferably equal to 8 bits.

The first and second fields are added and positioned as headers, as trailers or within the data packet of large size when the packet is coded according to a predetermined standard, or they are retained as headers within the payload of the packet when the packet is not coded and defined according to a predetermined standard.

The coded or uncoded packets use, for example, the DVB-S2 protocol.

The two end-to-end adaptive control loops for the adaptive control of coding and modulation (ACM; adaptive coding and modulation) thus performed make it possible to adapt the modulation and coding used by the high-speed stations or terminals and the satellites during a high-speed end-to-end transport of traffic packets of large size, in the first complete communication direction from the first station to the second station, and in the second, opposite, communication direction from the second station to the first station. These two loops allow the size of the buffer memories on the two access downlinks, namely the first downlink from the first satellite to the first station and the second downlink from the second satellite to the second station, to be limited.

Furthermore, as the coding is hardly changed, or even not changed at all, over both communication paths when coded or uncoded BBFRAME packets defined by the DVB-S2 protocol are used, it is possible to transparently route BBFRAME packets without additional on-board processing, resulting in an optimization of the spectral resources.

According to a variant of the method for the end-to-end transparent transport 352 of data packets of FIG. 5, a method for the end-to-end transparent transport of data packets according to the invention comprises the same steps 104, 106, 108, 110, 112, 354, 356, 358, 360 as the transport method 352 of FIG. 5, and additionally comprises an eleventh step, interposed between the ninth step 358 and the tenth step 360.

Here it is assumed that, in the ninth step 358, the first station also inserts information representing the fifth ratio SNIR5 into the second data return field.

In the eleventh step, the first, sending satellite 218 receives and extracts the fifth and sixth ratios SNIR5, SNIR6, then adapts the current modulation of the first downlink, implemented by the first, sending satellite 218, according to the highest value from the set formed by the fifth and sixth ratios SNIR5, SNIR6, while leaving the current coding unchanged.

It should be noted that the various embodiments of the transparent transport method according to the invention described above may also be implemented by a more centralized telecommunications system architecture in which the measurements of the SNIRs are sent to a coordination centre that reroutes them to the stations and to the satellites.

In this case, the satellite telecommunications system according to the invention additionally comprises a central coordination station for coordinating the telecommunications system. The telecommunications system is configured to route the measurements of SNIR1, SNIR2, SNIR3, SNIR4, SNIR5, SNIR6 from the satellites and the stations to the central coordination station and reroute said measurements via the central coordination station to the appropriate stations from among the first station and the second station and/or to the appropriate satellites chosen from among the sending satellite and the receiving satellite.

A computer program or product comprises a set of instructions that are configured to implement the various embodiments of the transparent transport method described above. The instructions of this set are loaded into and executed by one or more computers implemented in the telecommunications system described in FIGS. 1 and 4.

Figure 6:
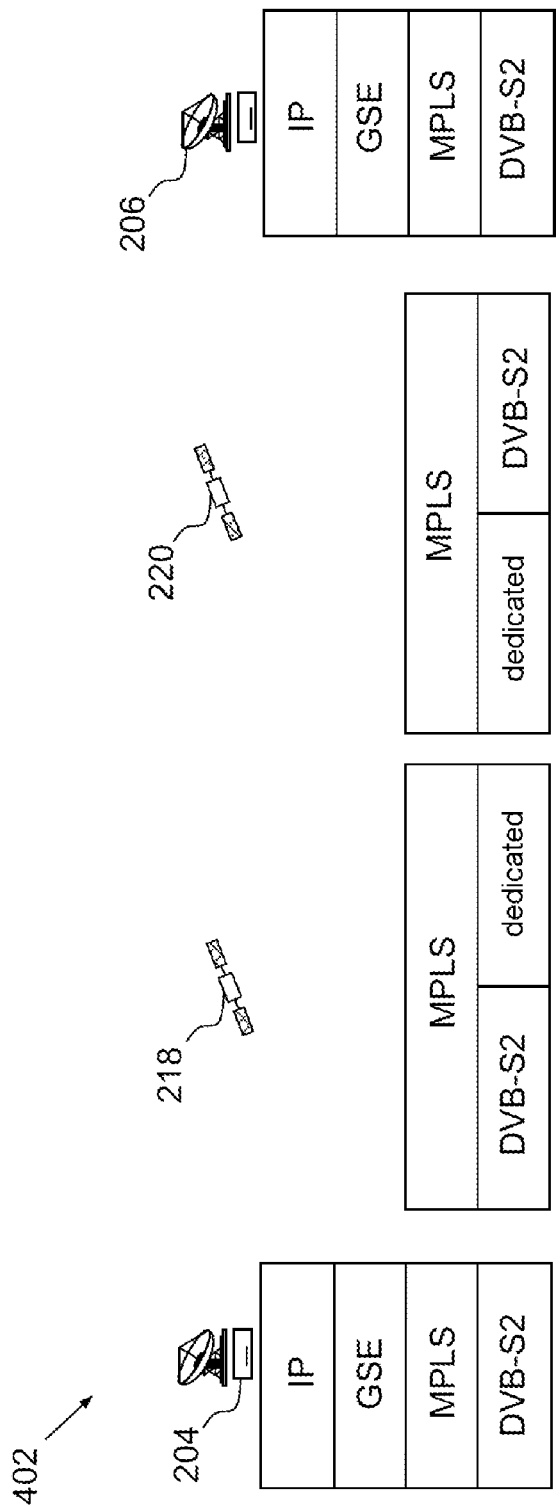
FIG. 6 is a protocol stack according to an OSI (open systems interconnection) representation of a method for the high-speed transfer of IP data packets from a first station to a second station and/or from the second station to the first station, in which the packets switched on board satellites of the spaceborne network are packets of large size which are defined according to the DVB-S2 protocol and in which the end-to-end bidirectional transparent transport method is implemented.

According to FIG. 6, a protocol stack 402 of a method for the high-speed transfer of IP data packets from the first station 204 to the second station 206 of FIG. 4 is provided according to an OSI representation. The transfer method here uses the method 352 for the high-speed end-to-end transport of data packets of large size, such as described in FIG. 5.

Here, in a particular and non-limiting manner, it is assumed that each packet is a BBFRAME packet before coding, defined according to the DVB-S2 standard, which comprises, within its payload, one or more GSE packets defined by ETSI according to the GSE (generic stream encapsulation) protocol, the GSE packets encapsulating IP packets in turn. The end-to-end transparent transport method 352 uses data fields, available in on-board routing labels, said on-board routing labels being used to route the DVB-S2 packets using an MPLS (multi-protocol label switching) protocol.

The invention claimed is:

1. A method for the end-to-end transparent transport of data packets implemented by a satellite telecommunications system, the telecommunications system comprising:
  a first, sending station; and
  a second, receiving station; and
  a first, sending satellite, connected directly to the first station by a first electromagnetic uplink from the first station and by a first electromagnetic downlink from the first satellite; and
  a second, receiving satellite, connected directly to the second station by a second electromagnetic uplink from the second station and by a second electromagnetic downlink from the second satellite;
  the first, sending satellite and the second, receiving satellite being interconnected via a spaceborne network comprising at least one inter-satellite link;
  the transparent transport method comprising a first step wherein:
    the first, sending station transmits a first data message, intended for the second, receiving station and fragmented into a single or multiple first data packets, each first packet having a generic structure, or frame, defined by a predetermined standard;
  the transparent transport method additionally comprising the steps wherein:
    in a second step, the first, sending satellite estimates a first signal-to-noise-plus-interference ratio SNIR1 of the first uplink on the basis of a first received current packet and inserts information representing the first ratio SNIR1 into a first data go-to field, added to the packet, and transparently retransmits said packet and the information contained within the first go-to field to the second satellite; then
    in a third step, the second satellite retransmits said first packet and the information contained within the first field to the second, receiving station; then
    in a fourth step, the second station estimates a second signal-to-noise-plus-interference ratio SNIR2 of the second downlink on the basis of said first packet retransmitted by the second satellite, then determines a third signal-to-noise-plus-interference ratio SNIR3 of a first complete link from the first station to the second station as being the minimum from the set formed by the first and second ratios SNIR1 and SNIR2, then inserts information representing the third ratio into a first data return field, added to or already included within a second packet of a second message intended for the first station, and transmits said second packet and the information contained within the first return field to the first station via the second satellite, the spaceborne network and the first satellite; then in a fifth step, the first station determines a first pair of modulation and coding parameters adapted according to the third ratio SNIR3 sent by the second station and transmits the packets of the first message or of other messages intended for the second station according to the first pair of parameters.

2. The transparent transport method according to claim 1, the first, second and third signal-to-noise-plus-interference ratios SNIR1, SNIR2, SNIR3 are estimated periodically according to a predetermined period expressed in time or in number of packets.

3. The transparent transport method according to claim 1, wherein, in the fourth step, the second station also inserts information representing the second ratio SNIR2 into the first data return field;

the transport method additionally comprising a sixth step, interposed between the fourth step and the fifth step, in which the second satellite receives and extracts the second and third ratios SNIR2, SNIR3, then adapts the current modulation of the second downlink according to the highest value from the second and third ratios SNIR2, SNIR3 while leaving the current coding unchanged.

4. The transparent transport method according to claim 1, additionally comprising the steps wherein:

in a seventh step, subsequent to the fourth step, the second, receiving satellite estimates a fourth signal-to-noise-plus-interference ratio SNIR4 of the second uplink on the basis of a second received current packet and inserts information representing the fourth ratio SNIR4 into a second data go-to field, added to the second packet, and transparently retransmits said second packet and the information contained within the second go-to field to the first satellite; then in an eighth step, the first satellite retransmits said second packet and the information contained within the second go-to field to the first station; then in a ninth step, the first station estimates a fifth signal-to-noise-plus-interference ratio SNIR5 of the first downlink on the basis of said second packet retransmitted by the first satellite, then determines a sixth signal-to-noise-plus-interference ratio SNIR6 of a second complete link from the second station to the first station as being the minimum from the set formed by the fourth and fifth ratios SNIR4 and SNIR5, then inserts information representing the sixth ratio SNIR6 into a second data return field, added to a first packet of the first message or of another message intended for the second station, and transmits said first packet and the information contained within the second return field to the second station via the first satellite, the spaceborne network and the second satellite; then in a tenth step, the second station determines a second pair of modulation and coding parameters adapted according to the sixth ratio SNIR6 sent by the first station and transmits the packets of the second message or of other messages intended for the first station.

5. The transparent transport method according to claim 4, the fourth, fifth and sixth signal-to-noise-plus-interference ratios SNIR4, SNIR5, SNIR6 are estimated periodically according to a predetermined period expressed in time or in number of packets.

6. The transparent transport method according to claim 4, wherein, in the ninth step, the first station also inserts information representing the fifth ratio SNIR5 into the second data return field;

the transport method additionally comprising an eleventh step, interposed between the ninth step and the tenth step, wherein the first satellite receives and extracts the fifth and sixth ratios SNIR5, SNIR6, then adapts the current modulation of the first downlink according to the highest value from the fifth and sixth ratios SNIR5, SNIR6 while leaving the current coding unchanged.

7. The transparent transport method according to claim 1, wherein:

the signalling steps, consisting of inserting and extracting the information representing the ratios SNIR1, SNIR2, SNIR3, SNIR4, SNIR5, SNIR6 added to the packets into/from a first field and a second field, are replaced by steps of routing the measurements of SNIR1, SNIR2, SNIR3, SNIR4, SNIR5, SNIR6 and of rerouting said measurements to the appropriate station from among the first station and the second station or to the appropriate satellite chosen from among the sending satellite and the receiving satellite, the routing and rerouting steps being implemented by a central coordination station for coordinating the telecommunications system.

8. The transparent transport method according to claim 1, wherein the one or more data packets of the first data packet and/or of the second data packet have the structure of a coded or uncoded baseband frame BBFRAME such as defined by the DVB-S2 protocol.

9. The transparent transport method according to claim 8, wherein the data packets switched on board the satellites are data packets having the structure of a baseband frame BBFRAME coded according to the DVB-S2 protocol and retaining the end-to-end coding structure.

10. A satellite telecommunications system for the end-to-end high-speed transparent transport of data and comprising:
a first, sending station; and
a second, receiving station; and
a first, sending satellite, connected directly to the first station by a first electromagnetic uplink from the first station and by a first electromagnetic downlink from the first satellite; and
a second, receiving satellite, connected directly to the second station by a second electromagnetic uplink from the second station and by a second electromagnetic downlink from the second satellite;
the first, sending satellite and the second, receiving satellite being interconnected via a spaceborne network comprising at least one inter-satellite link;
the first, sending station being configured, in a first step, to transmit a first data message, intended for the second, receiving station and fragmented into a single or multiple first data packets, each first packet having a generic structure, or frame, defined by a predetermined standard;
the telecommunications system wherein:
the first, sending satellite is configured to estimate, in a second step, a first signal-to-noise-plus-interference ratio SNIR1 of the first uplink on the basis of first received current packet and inserts information representing the first ratio SNIR1 into a first data go-to field, added to the packet, and transparently retransmits said packet and the information contained within the first go-to field to the second satellite; and the second, receiving satellite is configured to retransmit, in a third step, said first packet and the information contained within the first field to the second, receiving station; and the second station is configured to estimate, in a fourth step, a second signal-to-noise-plus-interference ratio SNIR2 of the second downlink on the basis of said first packet retransmitted by the second satellite, then determine a third signal-to-noise-plus-interference ratio SNIR3 of a first complete link from the first station to the second station as being the minimum from the set formed by the first and second ratios SNIR1 and SNIR2, then inserts information representing the third ratio SNIR3 into a first data return field, added to or already included within a second packet of a second message intended for the first station, and transmit said second packet and the information contained within the first return field to the first station via the second satellite, the spaceborne network and the first satellite; and the first station is configured to determine, in a fifth step, a first pair of modulation and coding parameters adapted according to the third ratio SNIR3 sent by the second station and to transmit the packets of the first message or of other messages intended for the second station according to the first pair of parameters.

11. The satellite telecommunications system according to claim 10, wherein:

the second, receiving satellite is configured to estimate, in a seventh step subsequent to the fourth step, a fourth signal-to-noise-plus-interference ratio SNIR4 of the second uplink on the basis of a second received current packet and inserts information representing the fourth ratio SNIR4 into a second data go-to field, added to the second packet, and transparently retransmit said second packet and the information contained within the second go-to field to the first satellite; and the first satellite is configured to retransmit, in an eighth step, said second packet and the information contained within the second go-to field to the first station; and the first station is configured to estimate, in a ninth step, a fifth signal-to-noise-plus-interference ratio SNIR5 of the first downlink on the basis of said second packet retransmitted by the first satellite, then determine a sixth signal-to-noise-plus-interference ratio SNIR6 of a second complete link from the second station to the first station as being the minimum from the set formed by the fourth and fifth ratios SNIR4 and SNIR5, then insert information representing the sixth ratio SNIR6 into a second data return field, added to a first packet of the first message or of another message intended for the second station, and transmit said first packet and the information contained within the second return field to the second station via the first satellite, the spaceborne network and the second satellite; and the second station is configured to determine, in a tenth step, a second pair of modulation and coding parameters adapted according to the sixth ratio SNIR6 sent by the first station and transmit the packets of the second message or of other messages intended for the first station.

12. A telecommunications system according to claim 10, additionally comprising a central coordination station for coordinating the telecommunications system; and wherein the signalling steps, consisting of inserting and extracting the information representing the ratios SNIR1, SNIR2, SNIR3, SNIR4, SNIR5, SNIR6 added to the packets into/from a first field and a second field, are replaced by steps of routing the measurements of SNIR1, SNIR2, SNIR3, SNIR4, SNIR5, SNIR6 and of rerouting said measurements to the appropriate station from among the first station and the second station or to the appropriate satellite chosen from among the sending satellite and the receiving satellite, the central coordination station for coordinating the telecommunications system being configured to implement said signal routing and rerouting steps.

13. A computer-readable medium comprising a set of instructions that are configured to implement a method of transparent transport of data when said instructions are loaded into and executed by one or more computers implemented in the telecommunications system defined according to claim 10.

14. The transparent transport method according to claim 1, wherein the first ratio SNIR1 is greater than the second ratio SNIR2.

15. The transparent transport method according to claim 1, wherein the second ratio SNIR2 is greater than the first ratio SNIR1.

16. The satellite telecommunications system according to claim 10, wherein the first ratio SNIR1 is greater than the second ratio SNIR2.

17. The satellite telecommunications system according to claim 10, wherein the second ratio SNIR2 is greater than the first ratio SNIR1.

* * * * *